(12) United States Patent
Lin et al.

(10) Patent No.: US 6,554,634 B1
(45) Date of Patent: Apr. 29, 2003

(54) ELECTRICAL CONTACT FOR ZIF SOCKET CONNECTOR

(75) Inventors: Nick Lin, Tu-Chen (TW); Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/104,881

(22) Filed: Mar. 22, 2002

(30) Foreign Application Priority Data

Dec. 19, 2001 (TW) .................................... 90222275 U

(51) Int. Cl.[7] ............................................. H01R 13/625
(52) U.S. Cl. ....................................... 439/342; 439/857
(58) Field of Search ................................ 439/342, 856, 439/857, 83

(56) References Cited

U.S. PATENT DOCUMENTS 5,766,045 A * 6/1998 Sawaki et al. .............. 439/857
6,450,826 B1 * 9/2002 Howell et al. .............. 439/342
6,471,534 B1 * 10/2002 Lee ............................ 439/342

* cited by examiner

Primary Examiner—Tho D. Ta
(74) Attorney, Agent, or Firm—Wei Te Chung

(57) ABSTRACT

A ZIF socket connector (20) includes a base (22), a cover (24), an actuator (26) and a number of electrical contacts (1). The cover is movably assembled to the base and the base defines a number of openings (221) extending therethrough to receive the electrical contacts. Each electrical contact has a base portion (10), a solder portion (12) extending from the base portion, and a pair of spaced arms (11). Each arm has a body section (110) extending from the base portion and a finger (111) including a lead-in section (120) extending from the body section and a contact section (130) extending from the lead-in section. The lead-in sections of the fingers are coined to define planar lead-in surfaces (121) for guiding a pin (42) of an electronic package (40) received on the cover to enter between and to electrically contact with the contact sections with a reduced push force.

11 Claims, 7 Drawing Sheets

US 6,554,634 B1

ELECTRICAL CONTACT FOR ZIF SOCKET CONNECTOR

BACKGROUND OF THE INVENTION

1. Field of the Invention

The present invention relates to an electrical contact for a Zero Insertion Force (ZIF) socket connector for electrically interconnecting an electronic package, for example a Central Processing Unit (CPU), with a printed circuit board, for example a mother board.

2. Description of the Related Art

Referring to FIGS. 5–7, an earlier design of the electrical contact 8 for a ZIF socket connector comprises a base portion 81, a solder portion 82 extending from an end of the base portion 81 and a pair of arms 83. Each arm 83 comprises a body section 831 extending upwardly from an opposite end of the base portion 81 and a finger 832. The fingers 832 of the arms 83 are offset from each other in a vertical direction of the electrical contact 8 and each comprises a lead-in section 840 extending from the body section 831 and a contact section 850 extending from the lead-in section 840. The lead-in section 840 is generally stamped and formed in a curved configuration and thus defines a generally curved lead-in surface 841.

After a pin 9 of an electronic package is inserted into the ZIF socket connector with zero insertion force, the pin 9 is pushed along the lead-in surfaces 841 to move in a direction as indicated by an arrow A into a contact space 860 to be pressed between and electrically contacted with the contact sections 850. A pushing force herein needed is comparatively large since, as known to one of ordinary skill in the pertinent art, an angle defined by a line B tangent to the contacting area of the curved lead-in surface 841 and the outer surface of the pin 9, and the push direction of the pin 9 is comparatively large. Furthermore, during the course of the pin 9 moving along the curved lead-in surfaces 841, the angle defined between the line B and the push direction of the pin 9 varies with the variation of the contacting area of the outer surface of the pin 9 and the curved lead-in surface 841, and even increases when the contacting area of the outer surface of the pin 9 and the lead-in surface 841 is adjacent to the outer entry of the lead-in sections 840 due to the curved configurations of the lead-in sections 840. The pin 9 is often falling within the areas outside the outer entry of the lead-in sections 840 because of errors in making either of the pin 9, the electrical contact 8 and an insulative housing (usually a base and a cover) of the ZIF socket connector. Thus, the pin 9 is easily in the risk of being blocked and needs a comparatively larger pushing force.

Therefore, a ZIF socket connector with an improved electrical contact is desired.

SUMMARY OF THE INVENTION

A major object of the present invention is to provide an electrical contact for a ZIF socket connector which reduces a pushing force of a pin of an electronic package.

A ZIF socket connector comprises a base, a cover, an actuator and a plurality of electrical contacts in accordance with the present invention. The cover is assembled to the base and is actuated by the actuator to be movable with respect to the base. The electrical contacts are received in the base. Each electrical contact comprises a base portion, a solder portion extending from the base portion, and a pair of arms. Each arm comprises a body section extending from the base portion, and a finger comprising a lead-in section extending from the body section and a contact section extending from the lead-in section. The lead-in sections of the fingers are coined to define generally planar lead-in surfaces which guide a pin of an electronic package received on the cover to extend between and electrically contact with the contact sections with a reduced pushing force.

Other objects, advantages and novel features of the invention will become more apparent from the following detailed description of the present embodiment when taken in conjunction with the accompanying drawings.

DETAILED DESCRIPTION OF THE INVENTION

Figure 1:
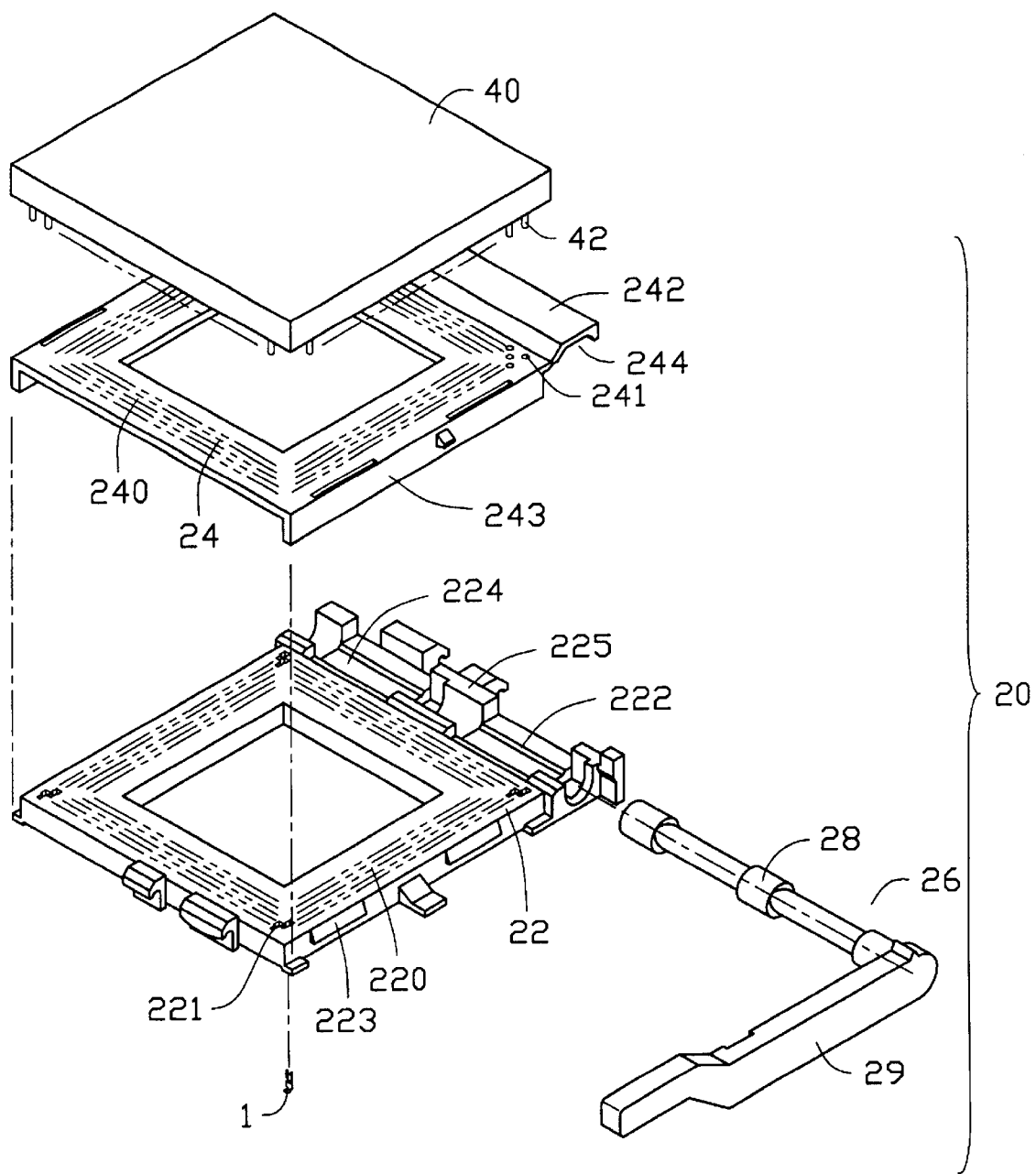
FIG. 1 is an exploded view of a ZIF socket connector employing electrical contacts in accordance with the present invention and an electronic package.

Referring to FIG. 1, a ZIF socket connector 20 in accordance with the present invention is to electrically connect an electronic package 40 having a plurality of pins (leads) 42 extending downwardly with a printed circuit board (not shown). The ZIF socket connector 20 comprises a base 22, a cover 24, an actuator 26 and a plurality of electrical contacts 1.

The base 22 is generally rectangular in shape and includes a rectangular base frame 220 and an actuator accommodating portion 222 on a side of the base frame 220. The base frame 220 is formed with a plurality of openings 221 extending therethrough for receiving the electrical contacts 1 therein and a plurality of protrusions 223 extending outwardly from outer surfaces thereof. The actuator accommodating portion 222 defines a slot 224 and a plurality of blocks 225 beside the slot 224.

The cover 24 is to assemble with the base 22 and has a rectangular cover frame 240 and an actuator accommodating portion 242 on a side of the cover frame 240. The cover frame 240 and the actuator accommodating portion 242 align with the base frame 220 and the actuator accommodating portion 222 of the base 22, respectively. The cover frame 240 comprises a plurality of holes 241 extending therethrough and corresponding in number to the electrical contacts 1 received in the openings 221, a pair of flanges 243 extending downwardly, and a plurality of recesses (not shown) defined in inner surfaces of the flanges 243. The recesses of the cover frame 240 are engageable with the protrusions 223 of the base frame 220 when the cover 24 is movably assembled to the base 22. The actuator accommodating portion 242 defines a groove 244 in a lower surface thereof to cooperate with the slot 224 to define a channel therebetween.

The actuator 26 comprises a lever 28 received within the channel defined by the slot 224 and the groove 244 and a handle 29 extending perpendicularly from an end of the lever 28. The actuator 26 could be in any other forms, as is known to one of ordinary skill in the pertinent art, used in all kinds of ZIF socket connectors, for example a cam extending in holes of the base and the cover, on the only condition that it can be manipulated to move the cover with respect to the base in use.

Figure 2:
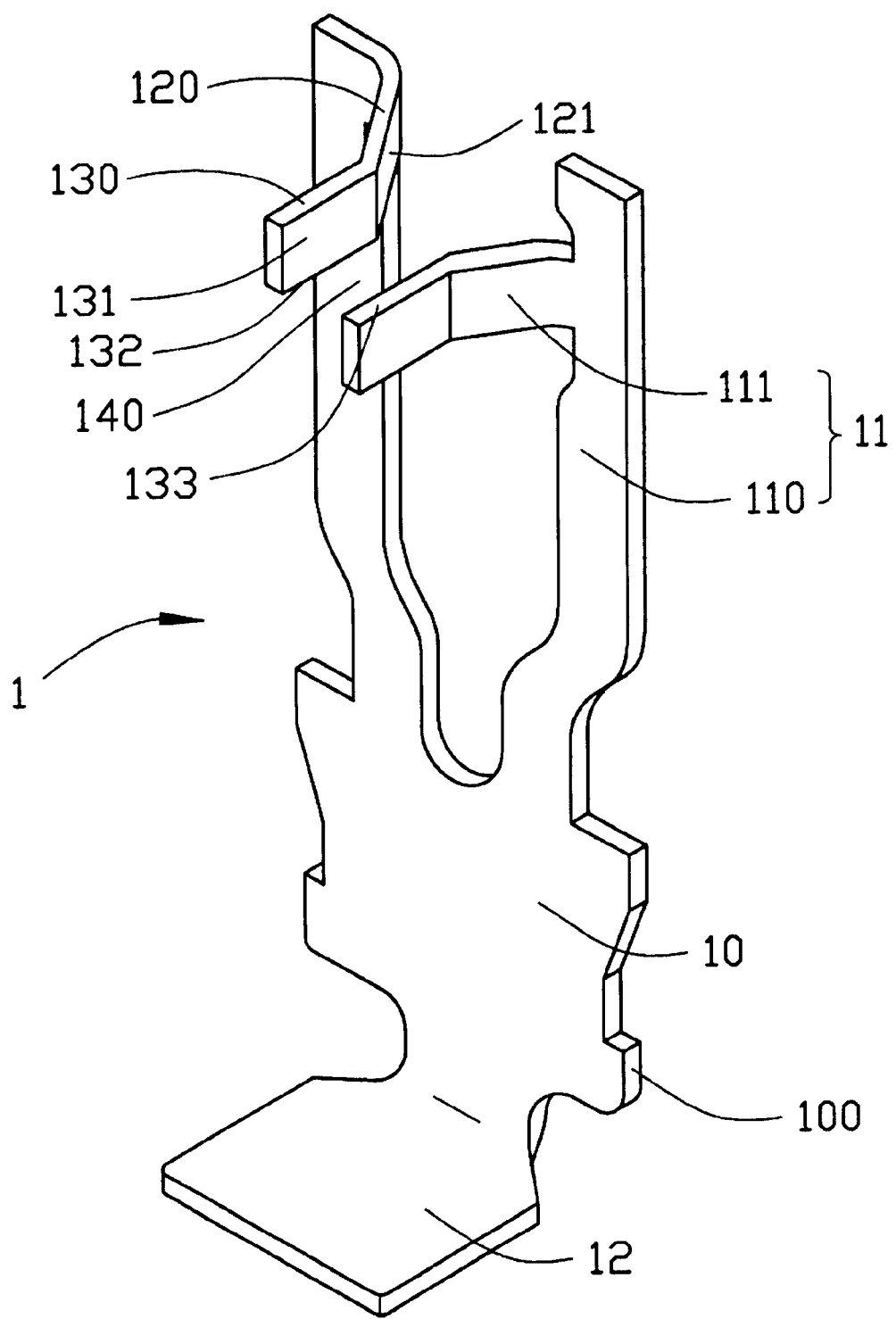
FIG. 2 is a perspective view of the electrical contact.

Referring to FIG. 2, each electrical contact 1 comprises a planar base portion 10, a solder portion 12 extending from a lower center section of the base portion 10, and a pair of spaced arms 11 extending upwardly from an upper section of the base portion 10. The base portion 10 is formed with a plurality of barbs 100 extending outwardly from laterally opposite sides thereof to engage with inner walls (not shown) of the openings 221 of the base 22, thereby securing the electrical contacts 1 in the openings 221, respectively. The solder portion 12 is generally rectangular and perpendicular to the base portion 10, and could be in any configurations as desired to be mounted to the printed circuit board to which the ZIF socket connector 20 is mounted.

Each arm 11 comprises a body section 110 extending upwardly from the base portion 10 and a finger 111 extending from the body section 110. The fingers 111 of the arms 11 are offset from each other in a vertical direction of the electrical contact 1, that is, a lower end 132 of one finger 111 is substantially above a top end 133 of the other finger 111. Each finger 111 comprises a lead-in section 120 extending inwardly and forwardly from an inner side of the body section 110 and a contact section 130 extending forwardly from a front end of the lead-in section 120. The contact sections 130 of the electrical contact 1 are horizontally spaced from each other and define a contact space 140 therebetween. A horizontal distance between contact surfaces 131 of the contact sections 130 is substantially smaller than a minimal diameter of the pin 42. The lead-in section 120 of each finger 11 is coined after the electrical contact 1 has been stamped and formed and defines a thus planar lead-in surface 121.

When the electronic package 40 is initially disposed on the cover 24, the pins 42, as is the case with all ZIF sockets, extend through the holes 241 of the cover 24 into the openings 221 of the base 22.

Figure 4:
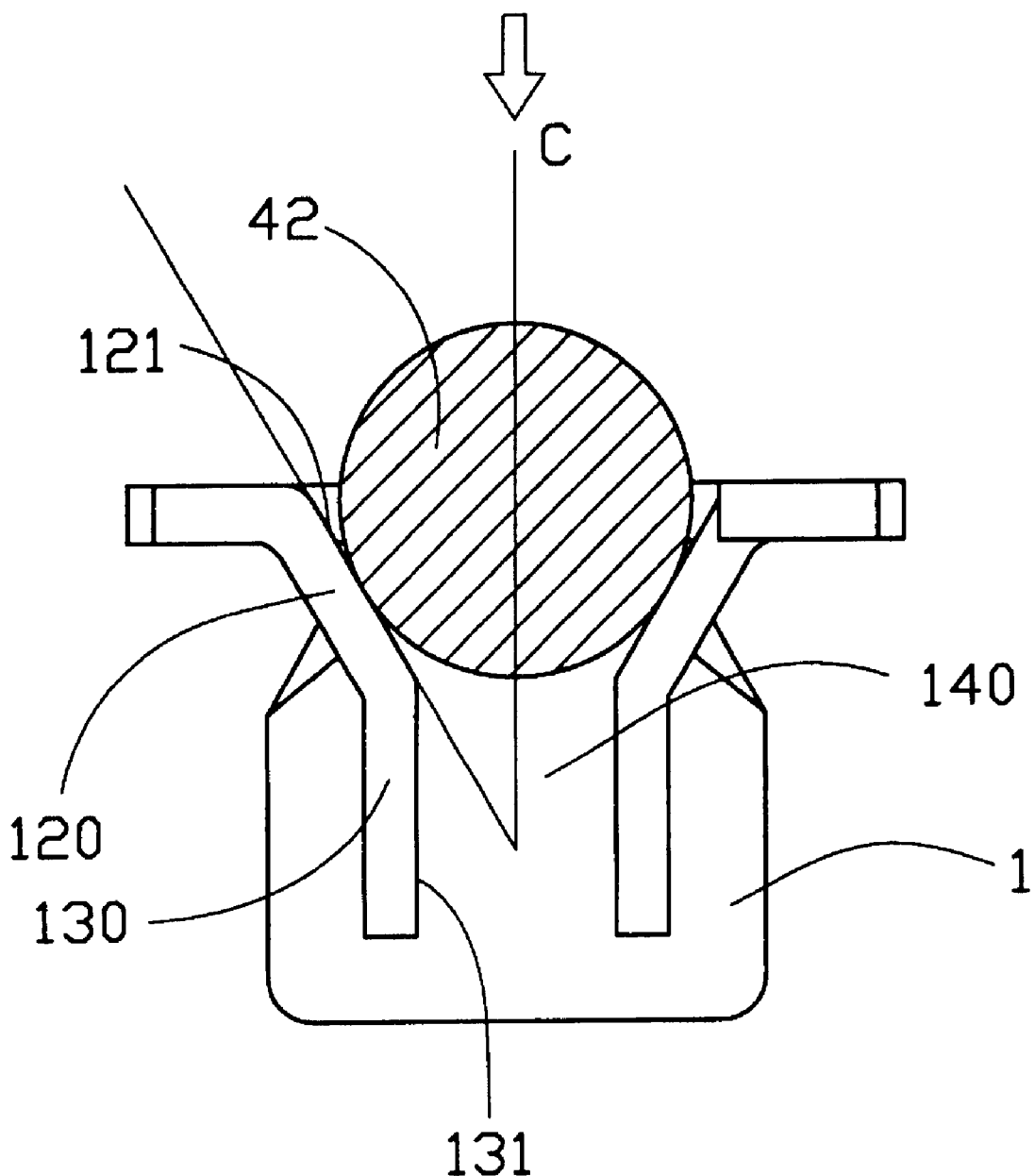
FIG. 4 is a top plan view of FIG. 3.
Figure 5:
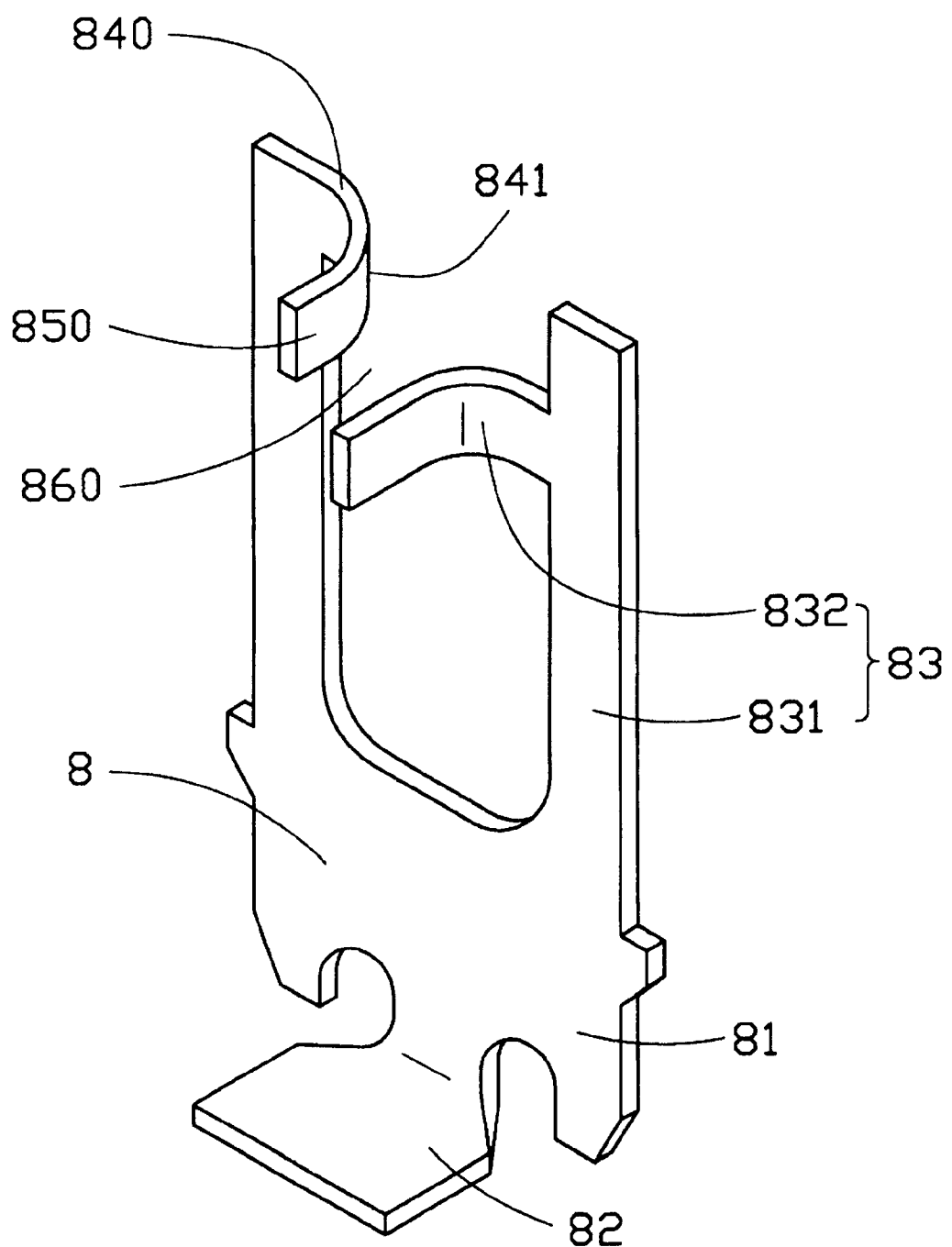
FIG. 5 is a perspective view of an electrical contact of related art.
Figure 6:
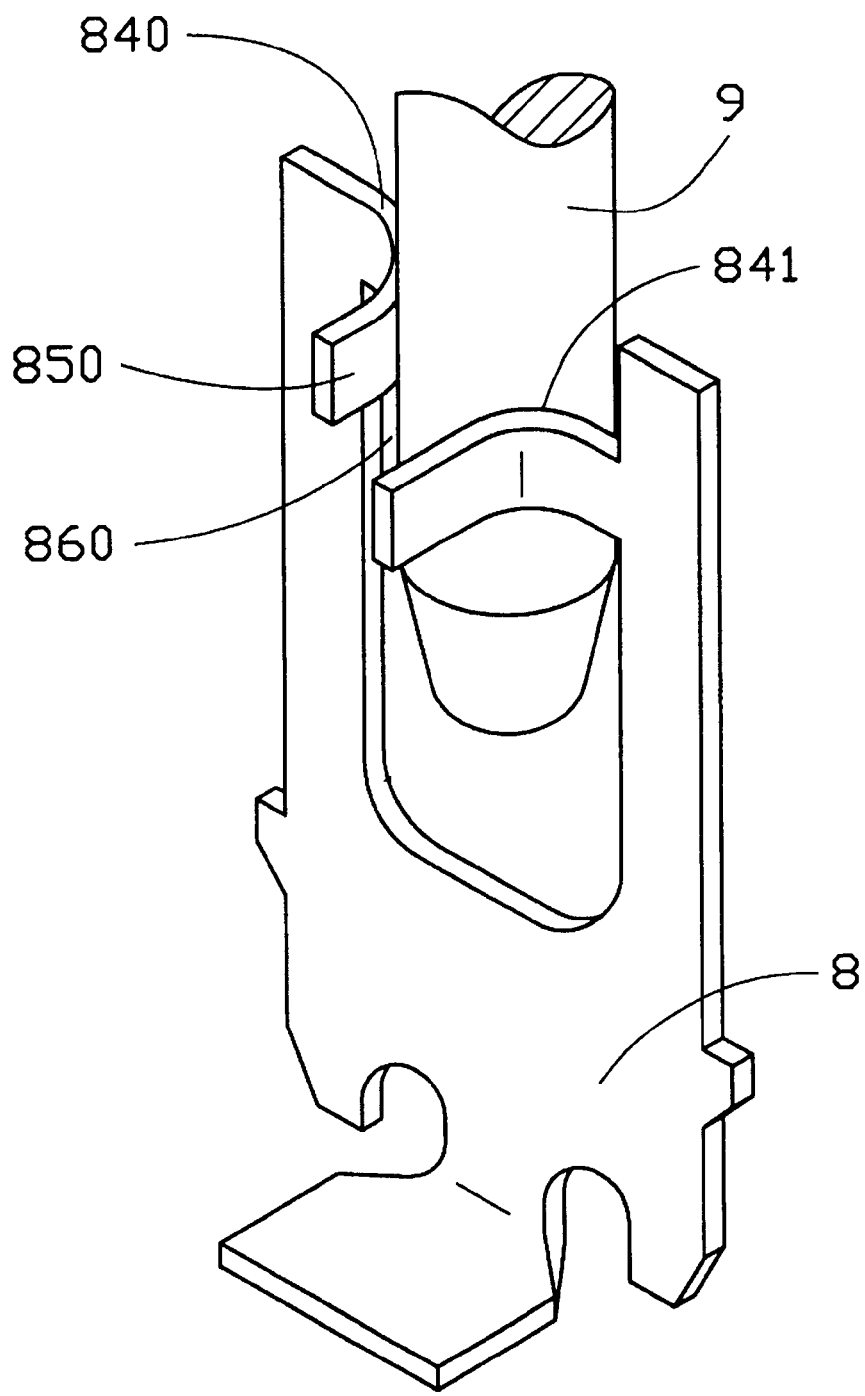
FIG. 6 is a view similar to FIG. 5 with the presence of a pin of an electronic package.
Figure 7:
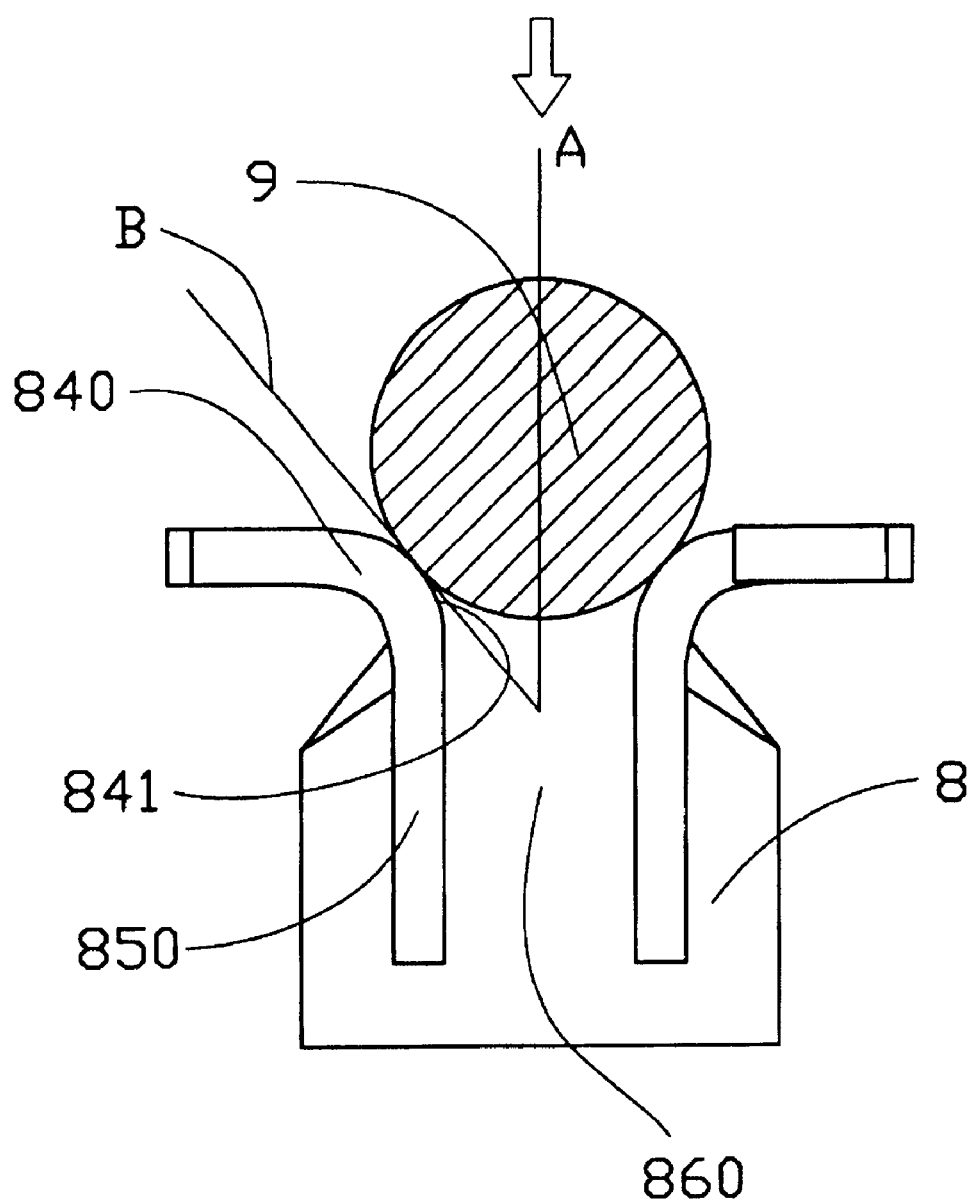
FIG. 7 is a top plan view of FIG. 6.

The cover 24 with the electronic package 40 is then actuated by the cooperation of the blocks 225 of the base 22 and the lever 28 of the actuator 26, which is in turn actuated by the handle 29, to move on the base 22 and to push the pins 42 along the generally planar lead-in surfaces 121 in a push direction as indicated by an arrow C in FIG. 4 to extend into between and electrically contact with the contact surfaces 131 of the contact sections 130.

Figure 3:
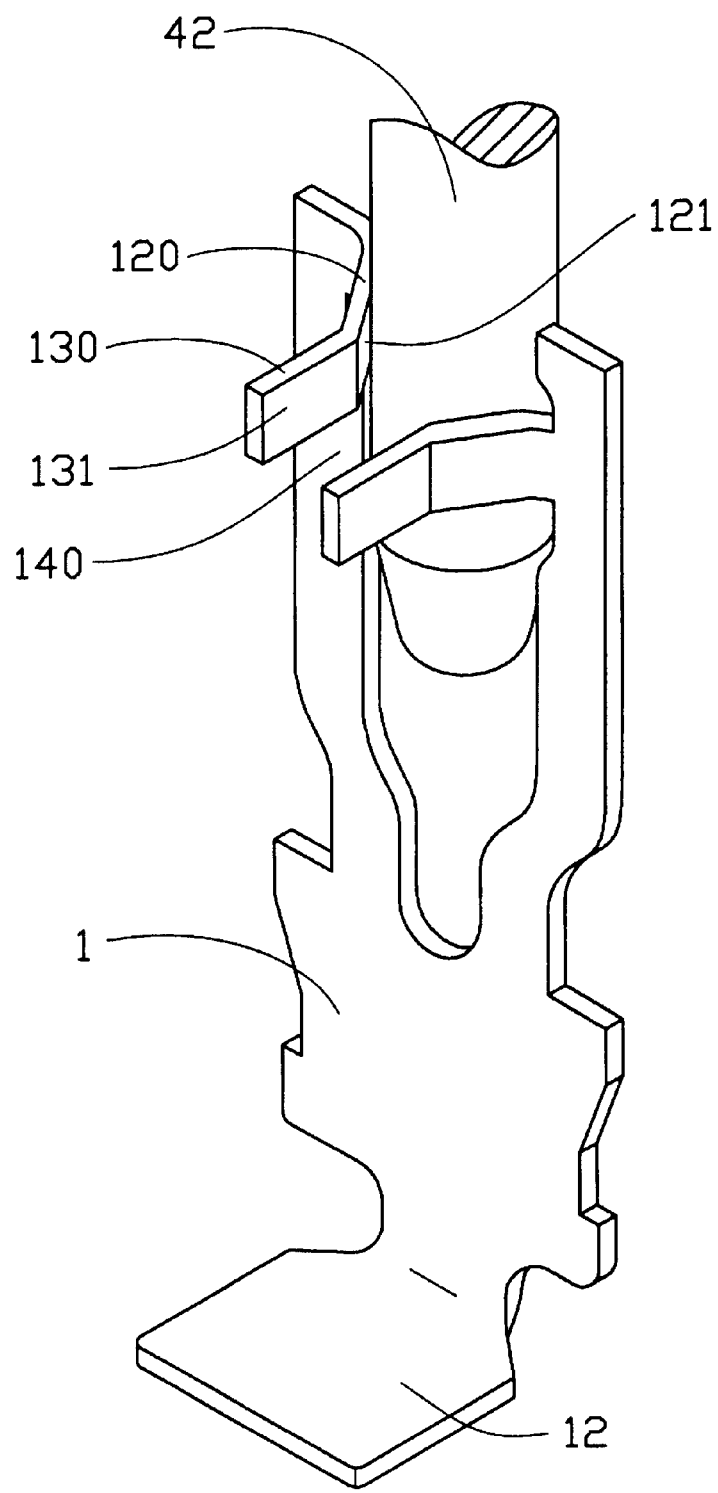
FIG. 3 is a view similar to FIG. 2 with the presence of a pin of the electronic package.

Referring to FIGS. 3 and 4, the lead-in section 120 of the electrical contact 1 is coined after stamped and formed in such a way that the generally planar lead-in surface 121 thereof defines a relatively smaller angle with respect to the push direction of the pin 42. During the course of the pin 42 moving along the lead-in surfaces 121, the angle is fixed and is significantly smaller than that of a conventional electrical contact which has curved lead-in surfaces without coining, a pushing force needed to push the pin 42 into the contact space 140 between the contact surfaces 131 of the contact sections 130 of the electrical contact 1 is thus fixed and is significantly reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF socket connector adapted for electrically connecting with an electronic package having a plurality of pins, comprising:

a base defining a plurality of openings extending therethrough;

a cover being assembled to the base and being adapted to receive thereon an electronic package having a plurality of pins;

an actuator optionally moving the cover with respect to the base; and a plurality of electrical contacts being received in the openings of the base, each electrical contact comprising a base portion retained to the base, a solder portion extending from the base portion, and a pair of arms, each arm comprising a body section extending from the base portion and a finger comprising a lead-in section extending from the body section and a contact section extending from the lead-in section, the lead-in sections being coined to define planar lead-in surfaces for guiding the corresponding pin of the electronic package to enter between and to electrically contact with the contact sections;

wherein said planar lead-in surfaces commonly define a space large enough for allowing the corresponding pin to have almost one half of cross-sectional area thereof pass the body sections, from a top viewpoint, in a moving direction of said corresponding pin, before said corresponding pin touches and actuates the fingers to be outwardly deflected.

2. The ZIF socket connector as claimed in claim 1, wherein the cover defines a plurality of holes corresponding in number to the electrical contacts for the pins of the electronic package to extend therethrough into the openings of the base.

3. The ZIF socket connector as claimed in claim 1, wherein the base portion of each electrical contact is formed with a plurality of barbs to engage with the base.

4. The ZIF socket connector as claimed in claim 1, wherein the solder portion is perpendicular to the base portion.

5. The ZIF socket connector as claimed in claim 1, wherein the fingers of the arms of the electrical contact are vertically offset from each other.

6. The ZIF socket connector as claimed in claim 1, wherein the pin of the electronic package is pushed into between the contact sections of the electrical contact in a direction and the lead-in surface of the electrical contact defines an angle with respect to the direction.

7. An electrical contact for a ZIF socket connector which mounts thereon an electronic package having a plurality of electrical pins, comprising:

a base portion being adapted for securing to a ZIF socket connector;

a solder portion extending from the base portion; and a pair of arms each comprising a body section extending from the base portion and a finger comprising a lead-in section extending from the body section and a contact section extending from the lead-in section, the lead-in sections of the fingers being coined to define planar lead-in surfaces for guiding a corresponding pin of an electronic package mounted on the ZIF socket connector to enter between and to electrically contact with the contact sections;

wherein said body section extends in a vertical plane while said corresponding finger extends in a horizontal direction;

wherein said lead-in surface is formed at a junction between said body section and the corresponding finger;

wherein said planar lead-in surfaces commonly define a space large enough for allowing the corresponding pin to have almost one half of cross-sectional area thereof pass the body sections, from a top viewpoint, in a moving direction of said corresponding pin, before said corresponding pin touches and actuates the fingers to be outwardly deflected.

8. The electrical contact as claimed in claim 7, wherein the fingers are vertically offset from each other.

9. The electrical contact as claimed in claim 7, wherein said contact is stamped from a sheet metal, and the fingers extend respectively from opposite inner edges of the corresponding body sections of said pair of arms, and are vertically offset from each other.

10. The electrical contact as claimed in claim 7, wherein the base portion is planar and the arms extend from a same side of the base portion.

11. The electrical contact as claimed in claim 10, wherein the solder portion is perpendicular to the base portion and extends from a side of the base portion opposite to the same side from which the arms extend.

* * * * *